United States Patent [19]

Doi et al.

[11] Patent Number: 4,507,189
[45] Date of Patent: Mar. 26, 1985

[54] PROCESS OF PHYSICAL VAPOR DEPOSITION

[75] Inventors: Yoshihiko Doi; Yoshiki Maeda; Mitsunori Kobayashi, all of Osaka, Japan

[73] Assignee: Sumitomo Electric Industries, Ltd., Osaka, Japan

[21] Appl. No.: 316,906

[22] Filed: Oct. 30, 1981

[30] Foreign Application Priority Data

Nov. 6, 1980 [JP] Japan .............................. 55-156584

[51] Int. Cl.³ ............................................. C23C 15/00
[52] U.S. Cl. ........................... 204/192 N; 204/192 C; 204/192 E; 427/39; 427/255.2; 427/309
[58] Field of Search ........ 204/192 N, 192 E, 192 EC, 204/192 C; 427/38, 39, 307, 309, 327, 255.2; 156/643

[56] References Cited

U.S. PATENT DOCUMENTS

| | | | |
|---|---|---|---|
| 3,411,938 | 11/1968 | Storck et al. | 427/39 |
| 3,915,757 | 10/1975 | Engel | 148/6 |
| 4,054,426 | 10/1977 | White | 51/309 R |
| 4,082,637 | 4/1978 | Misiano et al. | 204/192 E |
| 4,346,123 | 8/1982 | Kaufmann | 427/38 |

FOREIGN PATENT DOCUMENTS 52-9688  1/1977  Japan .............................. 204/192 N

OTHER PUBLICATIONS

M. Kobayashi et al., "TiN and TiC Coating on Cemented Carbides by Ion Plating", Thin Solid Films, 54(1978), pp. 67-74.
J. L. Vossen, Thin Film Processes, Academic Press, New York, 1978, pp. 497-498, 516-521.

Primary Examiner—G. L. Kaplan
Assistant Examiner—W. T. Leader
Attorney, Agent, or Firm—Wenderoth, Lind & Ponack

[57] ABSTRACT

The present invention relates to a process of physical vapor deposition which homogeneously and tightly coats hard compounds on the surface of cutting tools, parts requiring wear resistance or ornaments such as a watch case and the like in order to improve wear resistance, heat resistance, corrosion resistance, appearance and the like of said tools, parts or ornaments.

The present invention can provide a method of physically coating a solid solution consisting of at least one compound selected from the group consisting of carbides, nitrides or oxides of metals belonging to IVb, Vb and VIb groups of the Periodic Table and/or aluminum oxide and zirconium oxide on the surface of said tools, parts or ornaments in the form of a single layer or multiple-layers, wherein the surface of said tools and the like is subjected to sputter cleaning in the atmosphere of hydrogen or the gaseous mixture of hydrogen and inert gas wherein hydrogen is present at 20% by volume or more, to homogeneously clean said surface of said tools and the like and as a result, the adhesion of the coating consisting of said compounds on said tools and the like is improved and equalized. Thus the above-mentioned properties of said tools and the like is further improved.

13 Claims, 5 Drawing Figures

PROCESS OF PHYSICAL VAPOR DEPOSITION

The present invention relates to a process of physical vapor deposition which homogeneously and tightly coats hard compounds on the surface of cutting tools, parts requiring wear resistance or ornaments such as a watch case and the like in order to improve wear resistance, heat resistance, corrosion resistance, appearance and the like of said tools, parts or ornaments.

The technique of coating hard compounds in a vacuum on the surface of tools, parts or the like to improve wear resistance and corrosion resistance of said tools and the like has been widely used. Said hard compounds generally include carbides, nitrides and oxides of metals, which have higher hardness and chemical stability, belonging to IVb group (titanium, zirconium, hafnium), Vb group (vanadium, niobium, tantalum), VIb group (chromium, molybdenum, tungsten) and the like; or aluminium oxide or zirconium oxide; or solid solution of these compounds. The coating may be used in the form of a single layer or multiple layers. The present invention relates to a method of coating said compounds homogeneously and tightly. It goes without saying that the present invention is not limited to specific types and compositions of said hard compounds. Various kinds of coating methods, including chemical vapor deposition processes, physical vapor deposition processes and spray coating methods, have been used. Above all, the physical vapor deposition process has been applied in increasingly wide fields recently because said hard compounds can be tightly coated even at lower temperatures of room temperature to 500° C. and as a result the properties and precision of the substrates, that is to say said tools and parts, are not damaged.

However, in case of physical vapor deposition processes, the adhesion of the coating to said substrate is remarkably deteriorated if there are foreign layers such as an oxide layer, hydroxide layer and the like on the surface of said substrate because heat diffusion hardly progresses between said coating and said substrate due to the lower coating temperatures. It is, therefore, conventional to clean the surface of said substrates prior to coating in said physical vapor deposition process by causing positive ions of argon, which are generated by the glow discharge from a cathodic substrate at high voltage, to collide with said cathodic substrate to sputter said foreign layers away from the surface of said substrate that is to say sputter cleaning. Argon is used because it is inert and as a result it does not react chemically with said substrates, the sputtering yield of argon being large due to the larger molecular weight thereof. Also it is comparatively inexpensive and easily obtainable. Moreover nitrogen may be used for similar reasons.

However, the surface of said substrates is cleaned only by the sputtering action in said sputter cleaning using argon or nitrogen and as a result, the surface of convex portions, pointed end portions and corner portions of said substrates, with which said positive ions of gas collide with larger energy, can be easily cleaned while the surface of concave portions and the central portion of said substrates, with which said positive ions of gas collide with smaller energy, are difficultly cleaned. However, it is feared that the surface of concave portions and the central portion of said substrates are contaminated by the accumulation of oxides and the like coming from said convex portions, pointed portions and corner portions of said substrates which can be easily sputtered.

Accordingly, the known method of sputter cleaning has never given a coating of homogeneous adhesive strength. As a result, it was insufficient for physical vapor deposited articles, which have comparatively complex shapes and require the homogeneous adhesive strength, such as cutting tools, wear resistant parts, ornaments and the like.

The present invention will be described in detail hereinafter.

Figure 1:
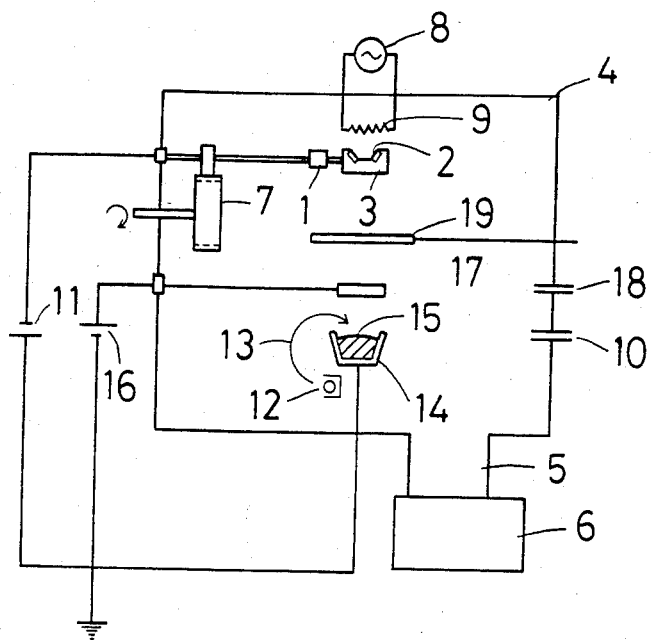
FIG. 1 depicts an example of apparatus used in the present invention.
Figure 2:
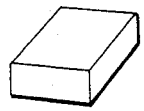
FIG. 2 is a perspective view showing an example of tips used in the preferred embodiments of the present invention.
Figure 3:
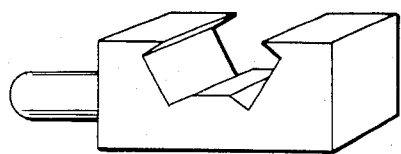
FIG. 3 depicts a holder provided with a tip mounted thereon.

The present invention is characterized by using hydrogen or a gaseous mixture of hydrogen and inert gas as the atmosphere in order to solve the problem of heterogeneously cleaning the surface of said substrates incidental to the known methods of vacuum coating, in which the surface of said substrates is cleaned only by the sputtering action of inert gas such as argon, nitrogen and the like. Until now hydrogen or gaseous mixtures containing hydrogen therein have not been used due to the small sputtering yield of hydrogen.

On the contrary, the present invention succeeded in homogeneously cleaning the surface of said substrates because the smaller sputtering yield can prevent said concave portions or the central portion of said substrates from being contaminated and the reducing reaction by hydrogen can be accelerated by glow discharge. In this case, a still more effective cleaning of said substrates can be attained by simultaneously heating said substrates.

The sputtering action is too weak when only hydrogen is used as the atmospheric gas. Accordingly, inert gas such as argon, nitrogen and the like may be added to hydrogen. Hydrogen is used at a ratio of 20% by volume or more, preferably at a ratio of 50% by volume or more because the homogeneous adhesive strength of the coating, which is an object of the present invention, cannot be attained if hydrogen is used in an amount below 20% by volume.

As to the physical vapor deposition processes used in the present invention, the ion plating method, in which the substances to be coated are ionized, is optimum because said hard compounds can be coated on said substrates tightly.

A process of physical vapor deposition of the present invention is especially effective for said substrates such as gear cutting tools and formed cutters having complex shapes and made of high-speed steel, for example, hobs, pinion cutters and the like.

The present invention further can provide a process of physical vapor deposition, which is especially effective for the cemented carbide tools or cermet tools, above all for throw away inserts. These tools themselves have comparatively simple shapes but it is necessary to rotate said substrates in said physical vapor deposition process in order to attain the homogeneous adhesive strength of the coating to said substrates. As a result, it is necessary to mount the holder on said substrates which gives complex shapes to an assembly consisting of said substrates and said holder as a whole.

It is desired that metals belonging to IVb group, Vb group and VIb group of the Periodic Table be used as materials for vacuum coating on said substrates. Above all titanium, which has a lower melting point and a higher vapor pressure, can be easily evaporated and its carbide, nitride, carbonitride or compounds consisting of said carbide, nitride or carbonitride of titanium and oxygen form a B-1 type have solid solution and high hardness, chemical stability and welding resistance to iron and steel materials. As a result, the above mentioned compounds of titanium are industrially the most suitable coating materials.

The preferred embodiments of the present invention will be described in detail hereinafter by reference to the attached drawings.

An object of the present invention is to give the coating a homogeneous and high adhesive strength regardless of the kind employed. Accordingly, titanium carbide is described as the typical example.

EXAMPLE 1

The ion plating apparatus shown in FIG. 1 was provided with a rotary axis 1 having a holder 3 provided with four tips 2 mounted on said holder 3. Said tips were made of high-speed steel SKH4A (Japanese Industrial Standard) having a hardness of $H_RC$ 64.5. A vacuum chamber 4 was evacuated through a pipe 5 by means of evacuated apparatus 6 until the pressure of $7\times10^{-3}$ Pa. Said rotary axis 1 was driven by a rotational mechanism 7, said tips 2 being heated to about 400° C. by means of a heater 9 supplied electricity from a power supply 8, and the gas used for sputter cleaning being introduced into said chamber 4 through a pipe for introducing gas used for sputter cleaning 10 until the pressure of 15 Pa. Gas used as said atmospheric gas for sputter cleaning includes "hydrogen of 100%" (condition I), "hydrogen of 80%+argon of 20%" (condition II), "hydrogen of 50%+argon of 50%" (condition III), "hydrogen of 30%+argon of 70%" (condition IV), "hydrogen of 20%+argon of 80%" (condition V), "hydrogen of 10%+argon of 90%" (condition VI) and "argon of 100%" (condition VII). Sputter cleaning of the surface of said tips was carried out in a glow discharge, which was generated by applying a voltage of $-1$ kV to said tips by means of a power supply for said substrates 11, for 20 minutes. Then said atmospheric gas used for sputter cleaning was exhausted again until the pressure of $7\times10^{-3}$ Pa and titanium 15 contained in a crucible 14 cooled by water was molten and evaporated by the electron beams 13 irradiated from an electron gun 12. The discharge owing to titanium vapor was generated between said titanium 15 and an ionizing electrode 17 by applying the voltage of $+50$ V to said ionizing electrode 17 by means of an ionizing power supply 16. A shutter 19 was opened after acetylene was introduced into said vacuum chamber 4 through a reaction gas pipe 18 until the pressure of $4.5\times10^{-2}$ Pa and titanium carbide was deposited on the surface of said tips 2 by the reaction of acetylene on titanium over 60 minutes. As a result the layer of titanium carbide was formed on the surface of said tips 2 at a thickness of 3 to 3.5 microns. Said tips vacuum coated under the above described conditions of I to VII were tested on indentations. The tips for the indentation test shown in FIG. 4 were pressed to give indentations at 9 positions of A to I shown in FIG. 5 at a load of 90 kg by means of a Rockwell hardness tester. Whether or not the layer of titanium carbide is peeled off in the periphery of said indentations was dertermined. The results are shown in Table I. o shows the absence of the layer of titanium carbide peeled off while x shows the presence of the layer of titanium carbide peeled off. It was found from Table 1 that adhesive strength of the layer of titanium carbide, which was heterogeneous when argon of 100% was used, began to be improved when hydrogen of 20%+argon of 80% was used and was completely homogenized when hydrogen of 50%+argon of 50% was used. These results certified the effect of the present invention.

TABLE 1

| Condition | Composition of gaseous mixtures | | Positions of test | | | | | | | | |
|---|---|---|---|---|---|---|---|---|---|---|---|
| | Hydrogen | Argon | A | B | C | D | E | F | G | H | I |
| I | 100 | 0 | o | o | o | o | o | o | o | o | o |
| II | 80 | 20 | o | o | o | o | o | o | o | o | o |
| III | 50 | 50 | o | o | x | o | o | o | x | o | o |
| IV | 30 | 70 | o | o | x | o | o | x | x | x | o |
| V | 20 | 80 | o | o | x | o | x | x | x | x | x |
| VI | 10 | 90 | o | x | x | x | o | x | x | x | x |
| VII | 0 | 100 | o | x | x | x | x | x | x | x | x |

EXAMPLE 2

Said tips 2 were made of cemented carbide P30 (72% WC-8% TiC-11% TaC-9% Co) or cermet (40% TiC-15% TiN-10% TaN-10% $Mo_2C$-10% WC-10% Co-5% Ni). The heating temperature of about 600° C., the pressure of an atmospheric gas used for sputter cleaning of 20 Pa and the compositions of said atmospheric gas used for sputter cleaning of the conditions of I to VII alike in Example 1 were selected.

Sputter cleaning of the surface of said tips 2 was carried out by glow discharge, which was generated by applying a voltage of $-1.5$ kV to said substrates 2, for 20 minutes.

Then said atmospheric gas used for sputter cleaning was exhausted again until the pressure of $7\times10^{-3}$ Pa and titanium 15 contained in a crucible 14 cooled by water was molten and evaporated by the electron beams 13 irradiated from an electron gun 12. The discharge due to titanium vapor was generated between titanium 15 and an ionizing electrode 17 by applying the voltage of $+70$ V to said ionizing electrode 17 by means of an ionizing power supply. A shutter 19 was opened after the gaseous mixture consisting of acetylene, nitrogen and oxygen at a ratio of 3:6:1 was introduced into said vacuum chamber 4 through a reaction gas pipe 18 until the pressure of $4\times10^{-2}$ Pa and titanium oxycarbonitride, that is to say $Ti(C_{0.28}N_{0.54}O_{0.18})$, was deposited on the surface of said tips 2 by the reaction of acetylene, nitrogen and oxygen upon titanium through 90 minutes. As a result the layer of titanium oxycarbonitride was formed on the surface of said tips 2 at a thickness of 4.8 to 5.3 μm.

Figure 5:
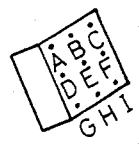
FIG. 5 shows the positions A to I at which a tip is tested on indentations.
Figure 4:
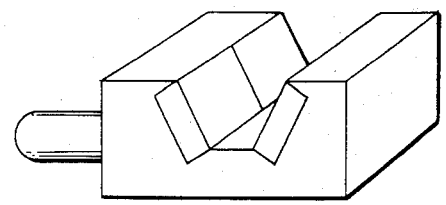
FIG. 4 is a perspective view showing the state in which a tip is mounted on a holder.

The tips for the indentation test shown in FIG. 4 were pressed to give indentations at 9 positions of A to I shown in FIG. 5 at a load of 60 kg by means of a Rockwell hardness tester. Whether or not the layer of titanium oxycarbonitrile is peeled off in the periphery of said indentations was determined. The results are shown in Table 2 and Table 3. o and x show the same means as in Table 1.

Table 2 shows the results for tips made of cemented carbide while Table 3 shows the results for tips made of cermet.

TABLE 2

| Condition | Compostion of gaseous mixture | | Positions of test | | | | | | | | |
|---|---|---|---|---|---|---|---|---|---|---|---|
| | Hydrogen | Argon | A | B | C | D | E | F | G | H | I |
| I | 100 | 0 | o | o | o | o | o | o | o | o | o |
| II | 80 | 20 | o | o | o | o | o | o | o | o | o |
| III | 50 | 50 | o | o | o | o | o | o | o | o | o |
| IV | 30 | 70 | o | o | x | o | o | o | x | o | o |
| V | 20 | 80 | o | o | x | o | o | x | x | x | o |
| VI | 10 | 90 | o | o | x | o | o | x | x | x | x |
| VII | 0 | 100 | o | o | x | o | o | x | x | x | x |

TABLE 3

| Condition | Composition of gaseous mixture | | Positions of test | | | | | | | | |
|---|---|---|---|---|---|---|---|---|---|---|---|
| | Hydrogen | Argon | A | B | C | D | E | F | G | H | I |
| I | 100 | 0 | o | o | o | o | o | o | o | o | o |
| II | 80 | 20 | o | o | x | o | o | o | x | o | o |
| III | 50 | 50 | o | o | x | o | o | o | x | o | o |
| IV | 30 | 70 | o | o | x | o | o | o | x | x | o |
| V | 20 | 80 | o | o | x | o | o | x | x | x | o |
| VI | 10 | 90 | o | x | x | x | x | x | x | x | x |
| VII | 10 | 100 | o | x | x | x | x | x | x | x | x |

It was found from Table 2 and Table 3 that the method of the present invention is also effective for said substrates made of materials such as cemented carbide and cermet.

Then also the layer of aluminum oxide and the layer of zirconium oxide were tested alike. Almost the same results as those shown in Tables 1 to 3 were obtained. These certified the effect of the present invention for the layer of aluminum oxide and the layer of zirconium oxide.

What is claimed is:

1. A process for physical vapor deposition which comprises coating at least one compound selected from the group consisting of carbides, nitrides or oxides of metals belonging to IVb, Vb and VIb groups of the Periodic Table, aluminum oxide and zirconium oxide or a solid solution consisting of said compounds on the surface of a substrate, wherein said surface prior to coating is subjected to sputter cleaning in an atmosphere of hydrogen or a gaseous mixture of hydrogen and inert gas wherein hydrogen is present at 20% by volume or more, to increase and homogenize the adhesive strength of said coating of said compound or said solid solution on said substrate.

2. The process of physical vapor deposition according to claim 1, wherein said substrate is high-speed steel.

3. The process of physical vapor deposition according to claim 1, wherein said substrate is cemented carbide or cermet.

4. The process of physical vapor deposition according to claim 1, wherein said coating is made of carbides, nitrides and carbonitrides of titanium or a solid solution of the B-1 type thereof containing oxygen or aluminum oxide or zirconium oxide.

5. The process of physical vapor deposition according to claim 1, wherein said vapor deposition is carried out by the reactive ion plating method.

6. The process of physical vapor deposition according to claim 1, wherein said substrate is a cutting tool having an uneven surface with indentations.

7. The process of physical vapor deposition according to claim 2, wherein said substrate is a cutting tool having an uneven surface with indentations.

8. The process of physical vapor deposition according to claim 3, wherein said substrate is a cutting tool having an uneven surface with indentations.

9. The process of physical vapor deposition according to claim 4, wherein said substrate is a cutting tool having an uneven surface with indentations.

10. The process of physical vapor deposition according to claim 5, wherein said substrate is a cutting tool having an uneven surface with indentations.

11. The process of physical vapor deposition according to claim 1, wherein said coating is titanium carbide.

12. The process of physical vapor deposition according to claim 1, wherein said coating is $Ti(C_{0.28}N_{0.54}O_{0.18})$.

13. The process according to claim 1 wherein said atmosphere contains a mixture of hydrogen and an inert gas, wherein hydrogen is present at 20% by volume or more.

* * * * *